(12) United States Patent
Peets

(10) Patent No.: US 7,683,267 B2
(45) Date of Patent: Mar. 23, 2010

(54) COLLAPSIBLE EMC GASKET

(75) Inventor: Michael T. Peets, Staatsburg, NY (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 11/947,248

(22) Filed: Nov. 29, 2007

(65) Prior Publication Data

US 2009/0141471 A1  Jun. 4, 2009

(51) Int. Cl.
  *H05K 9/00*  (2006.01)
(52) U.S. Cl. .................. 174/355; 174/377; 361/816
(58) Field of Classification Search .......... 174/354, 174/355, 366, 377; 361/816, 818, 800
  See application file for complete search history.

(56) References Cited

U.S. PATENT DOCUMENTS 5,943,219 A * 8/1999 Bellino et al. ............... 361/816
6,625,039 B2 * 9/2003 Barringer et al. ............ 361/800
6,646,197 B1 * 11/2003 Cugalj et al. ................ 174/355
6,660,932 B1 * 12/2003 Barringer et al. ............ 174/358
6,794,571 B1 * 9/2004 Barringer et al. ............ 174/359
6,924,988 B2 * 8/2005 Barringer et al. ............ 361/818
7,540,757 B2 * 6/2009 Loparco et al. ............. 439/374

* cited by examiner

*Primary Examiner*—Hung V Ngo
(74) *Attorney, Agent, or Firm*—Geraldine D. Monteleone; Lily Neff; Ido Tuchman

(57) ABSTRACT

A method and associated assembly is provided for a collapsible EMC gasket is provided. In one embodiment, the gasket comprises a flexible conductive sheet disposed between corner of a first and a second surface of a computer frame capable of housing electronic components. The sheet is larger in area than the corner area of the frame such that when disposed, said sheet forms a curved structure. The sheet is being fabricated of a material that can be compressed and then decompressed back to its original shape.

19 Claims, 3 Drawing Sheets

COLLAPSIBLE EMC GASKET

BACKGROUND OF THE INVENTION

1. Field of the Invention

The present invention relates to packaging of computing systems and more particularly to an electromagnetic compatibility (EMC) sealing apparatus and related method such as used in computing system environments.

2. Description of Background

The industry trend has been to continuously increase the number of electronic components inside computing systems. Unfortunately, while the number of these components is increased, the foot print of these systems remains the same or is even reduced. This is because installation, transportation and storage issues of the consumers have to be addressed. Lighter, and more compact systems are often more attractive to potential consumers. Unfortunately, storing many components in a tight footprint, despite its many advantages, also creates challenges for the designer of these systems. Moreover, while increasing the components inside a simple computing system does create some challenges, such an increase in larger more sophisticated system environments create even greater problems.

A particularly challenging area for the designers of these systems is the issue of resolving electromagnetic interference (EMI). Every device or component emits a certain amount of electromagnetic radiation, also referred to as electromagnetic leakage. However, as the number of components are increased, electromagnetic leakage concerns continue to grow. In larger system environments, where the components are packaged in close proximity to one another, the increased number of components and the system footprint greatly increases the EMI concerns since the leakage from one device can greatly affect the proper function of a close by component. Consequently, unresolved EMI leakage can affect system performance, data integrity and speed of the entire system environment. This is because while such effects can be tolerated when few devices and components exist, the increasing number of components and devices can seriously impact system integrity and performance. In addition, many recent semiconductor devices that operates at higher speeds, cause even greater electromagnetic emission in higher frequency bands where interference is more likely to occur.

One way to address or minimize electromagnetic interference is through electromagnetic shielding. Electromagnetic shielding is the process of limiting the flow of electromagnetic fields between two locations, by separating them with a barrier made of conductive material. In addition, proper device operation and electromagnetic compatibility (EMC) requires that emissions from a given device be reduced by shielding or other similar means. Such shieldings are designed not only to reduce emissions from the device itself, but also to reduce sensitivity of the device to external fields such as fields from other devices. One type of such EMI shielding comprises EMI gaskets.

In many computing system environments, a metallic type of electromagnetic gasket is used to contain EMC emissions in an electrical enclosure in which a device having a printed circuit board or card assembly is engaged. In these cases, while the EMC emissions need to be contained when this card is plugged, it is desired for the gasket to be designed such as to allow the card to retract back into its chassis prior to plugging or when the card is removed from the system. Unfortunately, the prior art does not provide adequate solutions to allow for the easy retraction and removal of the card.

It is therefore, desirable to have an apparatus and related method that can provide for this while providing a superior electromagnetic shield.

SUMMARY OF THE INVENTION

The shortcomings of the prior art are overcome and additional advantages are provided through the provision of a method and associated apparatus for a collapsible gasket. In one embodiment, the gasket comprises a flexible conductive sheet disposed between corner of a first and a second surface of a computer frame capable of housing electronic components. The sheet is larger in area than the corner area of the frame such that when disposed, said sheet forms a curved structure. The sheet is also being fabricated of a material that can be compressed and then decompressed back to its original shape.

In an alternate embodiment, the EMC gasket comprises a first conductive portion moveable from a first position to a second position and a secondary conductive portion secured to said first portion on one side. The secondary portion being capable of being secured to an outside edge of the computer housing. The gasket also comprises a third conductive portion disposed on an opposite side of the secondary portion such that the first portion is disposed between the second and the third portion. The third portion being secured to the first portion on an adjacent side and fabricated of a flexible material such that it is curved in structure. When disposed in a housing, this curved structure is wedged at a corner of the housing.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DESCRIPTION OF THE INVENTION

Figure 1:
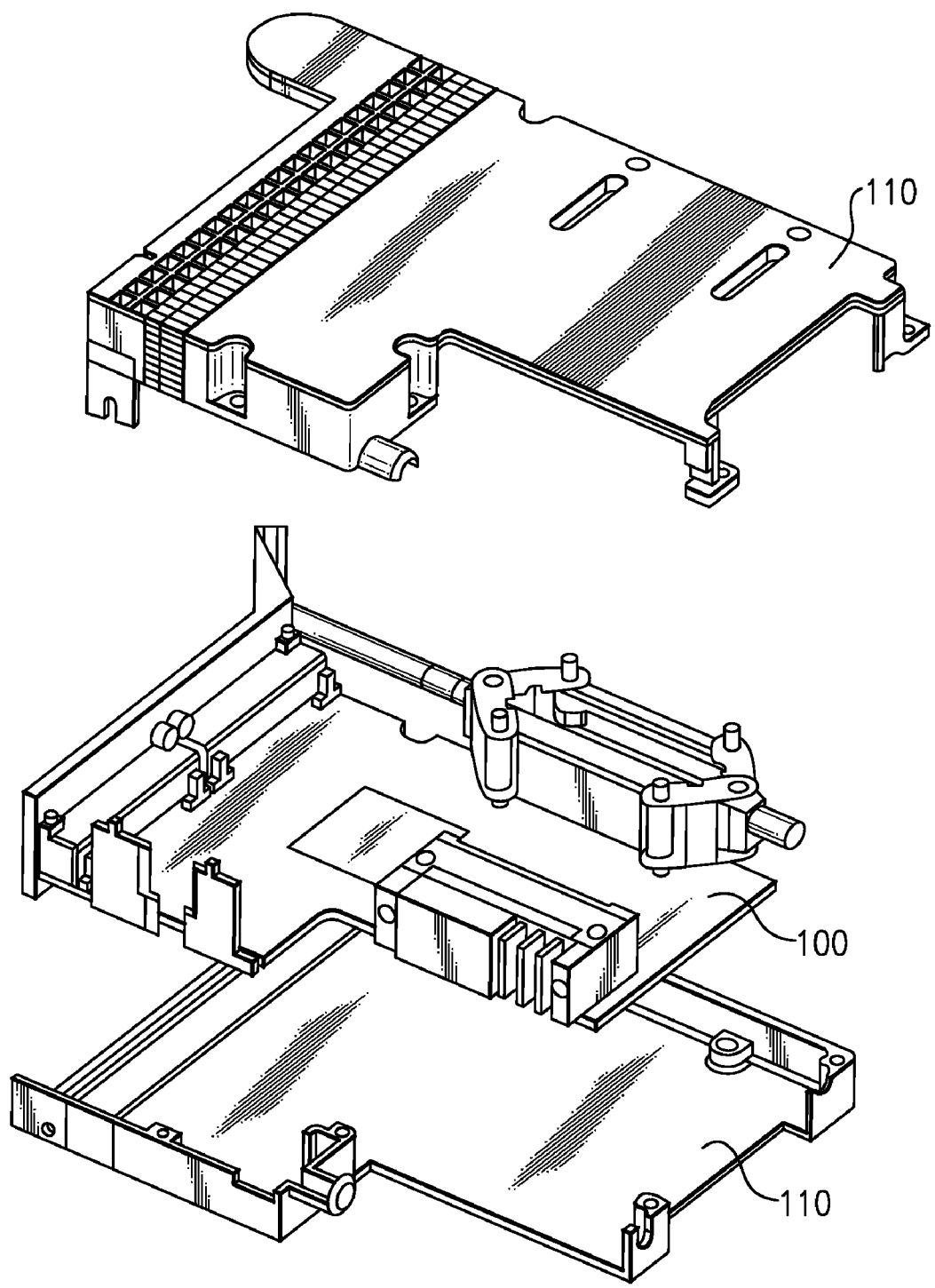
FIG. 1 is a side view perspective illustration of a computer housing assembly used such as for housing electronic boards and cards.

FIG. 1 is a side view perspective illustration of a computer housing assembly used such as for housing electronic boards and cards. In one embodiment of the invention, as illustrated, the housing can be comprised of a plurality of sections, but this is not a requirement. In the illustration of FIG. 1, the electronic card will be disposed in the main housing section referenced by numerals 100. Optionally, either a top, a bottom or both covers can also be disposed around the main housing section 100 as well. The covers are referenced in FIG. 1 by numerals 110. The housing 100/110 including the card or board can further be disposed or placed on a computer rack or frame (not illustrated) such as used in connection with very large and complex computing system environments.

In order to ensure proper operation of the computing device, EMC emissions of the electronic components need to be contained once the card is plugged. However, if an EMC gasket is used, it is desirous for the gasket to flex to allow the card to retract back into its chassis prior to plugging or when the card is removed from the computing system environment. The embodiment provided in FIGS. 2 and 3 provide for a plurality of alternate embodiments, where the gasket provides this flexibility.

Figure 2:
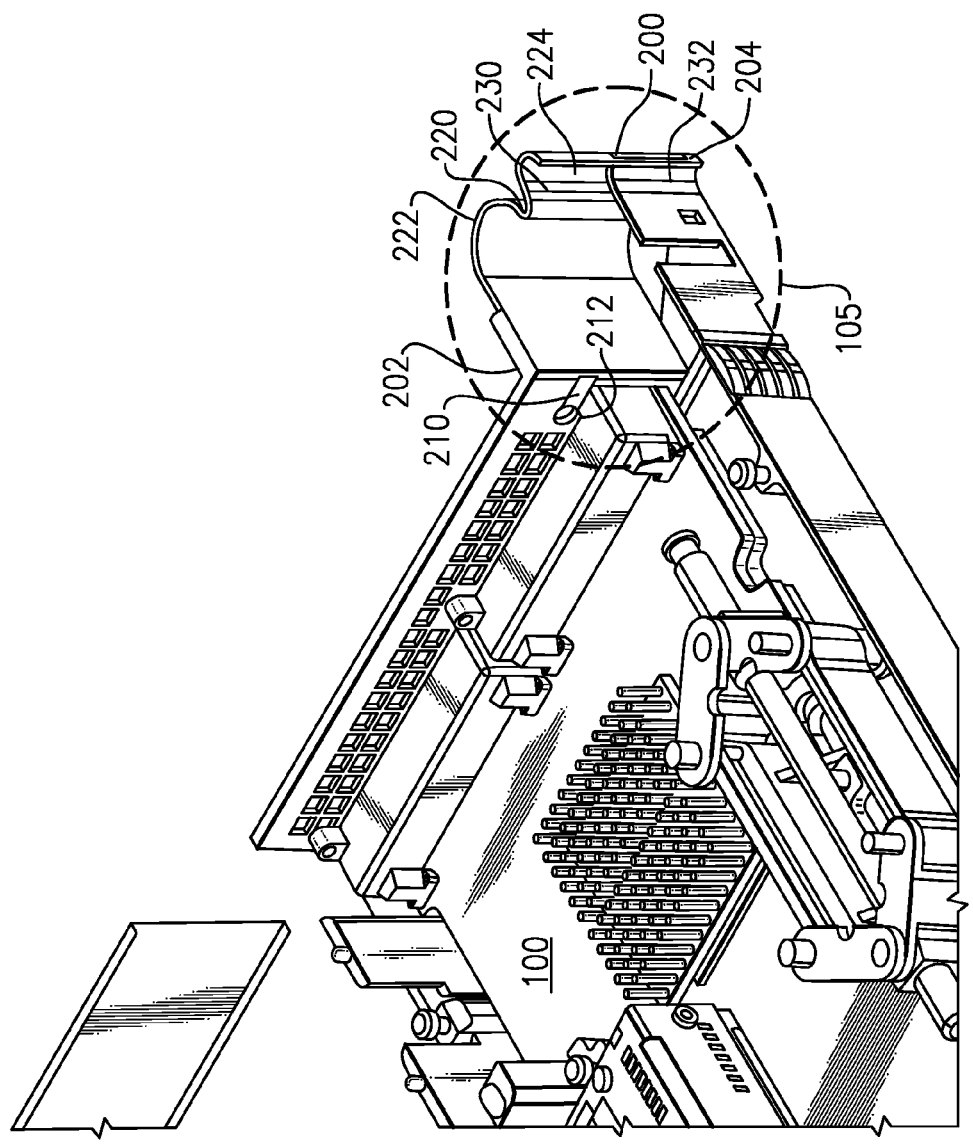
FIG. 2 provides a first embodiment of the present invention having an collapsible EMC gasket.
Figure 3:
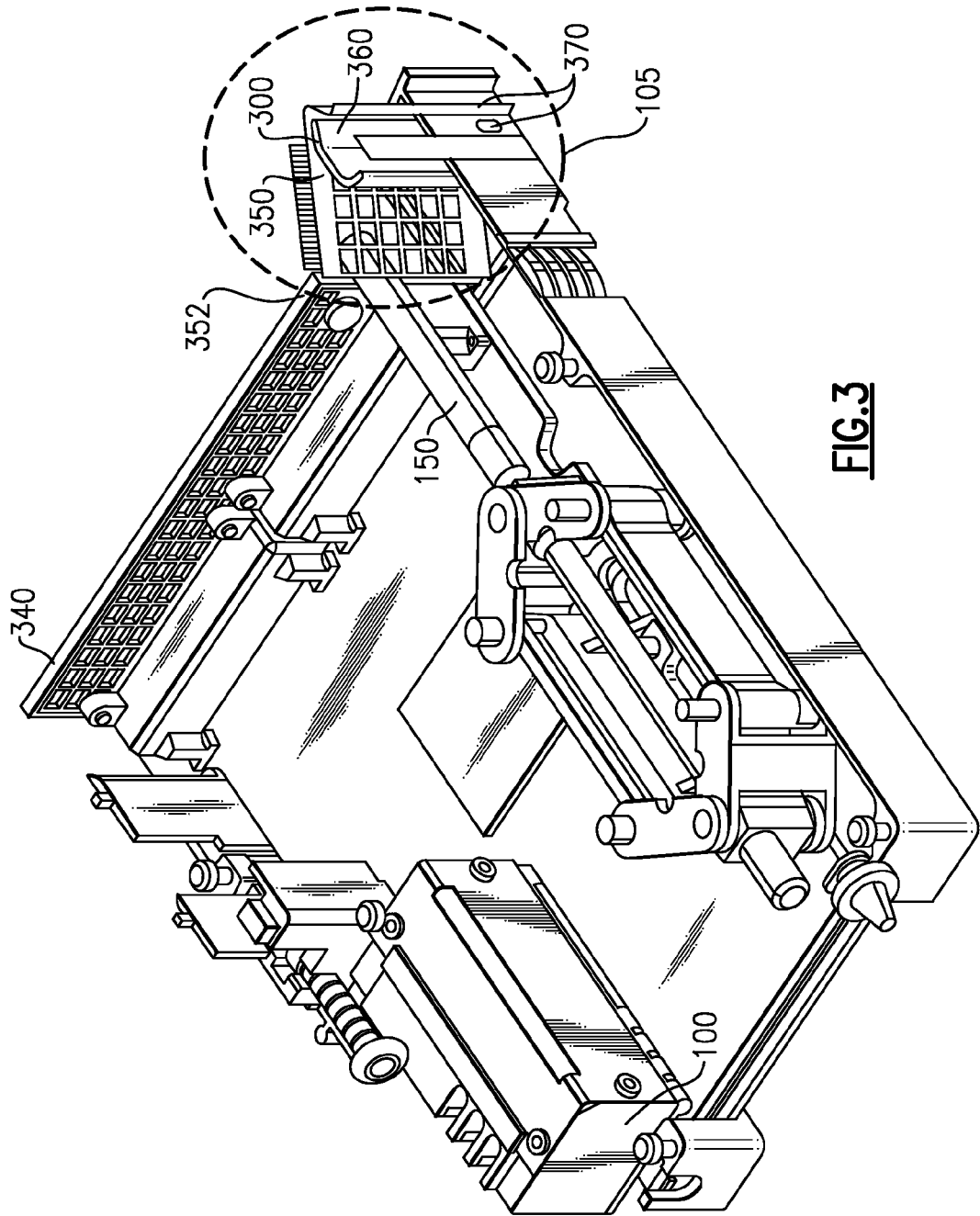
FIG. 3 provides an alternate embodiment of the present invention having an alternate EMC gasket.

FIG. 2 provides a first embodiment of the present invention having an EMC gasket. FIG. 2 is an illustration of a main housing 100 of a computing device that houses an electronic board or card such as was discussed in conjunction with FIG. 1. The EMC gasket in this embodiment is referenced in the figure by numerals 200.

As illustrated, in this embodiment, the EMC gasket 200 is disposed between a first and second surface, of the housing 100 and preferably to one corner 105 of the housing as shown. In one embodiment, the gasket can be secured to outside edges or locations of the housing. The gasket is formed of a conductive material and is fabricated to be flexible. Preferably the gasket is fabricated of a flexible metal sheet that can be disposed compressed a first to a second position when force is applied on it. It would also be preferable to utilize a material with good material memory so that the gasket can be released back to its original shape (substantially) after compression.

In one embodiment as shown, the EMC gasket 200 flexes in a way as to allow a plugged in card to travel back and forth in the housing 100. In this embodiment, the EMC Gasket 200 flexes and make contact with the housing 100 on all edges. In order to provide this feature, in a preferred embodiment the gasket 200 as illustrated has a curved shaped structure that substantially resemble a U shaped structure. The curved shape is achieved by fabricating the gasket 200 out of a flexible conductive sheet that is selectively measured to be larger in length than the area it is intended to cover.

The conductive sheet that is to become the gasket is then secured preferably on its two sides, referenced by numerals 202 and 204, selective to the sides of the areas of the housing 100, by a variety of means known to those skilled in the art. It is possible in one embodiment of the invention to even include fastening means on the gasket sheet (200) or the housing (100) or both, optionally, to enhance the securing of the gasket. In the illustrated figure an example of this is provided as illustrated by numerals 210 and 212. In this scenario, an appendage such as a fastening tab 210 is provided as part of the gasket design. The tab 210 is then secured to the housing 110 by means of a fastener, such as a screw referenced as 212. Complementary opening or apertures can be provided on the tab 210 and the housing 100 as desired to aid securing the gasket 200 to the housing 100 as illustrated. It should be understood, however, that the illustrative example is only provided to aid understanding and should not be considered as a limitation of the workings of the present invention as alternative securing means are possible as discussed and known to one skilled in the art.

Referring back to FIG. 2, the curved shape of the gasket 200 (after installation) allows the gasket to slide and collapse back on it self when the housing 100 including the card is inserted or plugged such as inside a computer rack or frame. In some embodiment, as illustrated in FIG. 2, it is possible to enhance flexibility of the gasket and balance it with some structural support by providing one or more indentures while fabricating the sheet 200. The resulting structure can then have a variety of designs that can include dips and/or multi directional curves. One such example is provided in FIG. 2.

In FIG. 2, besides the main curved structure (222), an oppositional curved dip 220 is also provided. A secondary curved structure 224 is also provided. The purpose of these indentures is to optimize rigidity and bounce. The design can enhance the securing of the gasket to the frame as it can improve the fit and duplicate a complementary design. For example, in the example illustrated in FIG. 2 to enhance this feature and to help the gasket to be disposed on the housing 100 securely ridges are provided on the gasket 200 in areas enumerated as 230 to mimic housing ridges enumerated and referenced as 232. In addition, the side tip 204 of the gasket is shaped as to extend over the housing edge to provide enhanced securing means.

FIG. 3 provides an alternate embodiment of the present invention. In FIG. 3, a perspective side view of a housing 100 is provided. For consistency the housing 100, is shown to have the same numerals as used in FIGS. 1 and 2 but any other type of housing is equally applicable. The alternate gasket as shown in this figure is referenced as 300 to differentiate it with the previous gasket 200 as was discussed in conjunction with the embodiment of FIG. 2.

As illustrated, in this embodiment, the EMC 300 gasket is similarly disposed on the outside of the housing 100 and preferably to one corner side of the housing as shown. The gasket 300 is formed of a conductive material and is fabricated to be flexible as before. In a similar way as before, the gasket 300, even though structurally very different than that of gasket 200 of FIG. 2 is still fabricated with characteristics that allow it to flexes in a way as to allow a plugged in card to travel back and forth in the housing 100. As before, in this embodiment, the EMC Gasket 300 also flexes in a way as to make contact with the housing 100 on all edges The gasket 300 comprises of a plurality of conductive portions as illustrated. The first portion is referenced as 350 and is designed to enable movement from a first to a second position to accommodate a housing including a card to be removed or plugged as necessary. In this embodiment, this first portion is fabricated with apertures to help maintain its light weight characteristics and to enhance move ability. The apertures 354, as shown can be used to further secure the gasket 300 to the housing 100 by using rod 150. The rod which is in turn connected to the housing 100 can be used to further facilitate the movement of the gasket portion from a first to a second position as discussed. As before the gasket 300 and especially the first portion 350 can also be secured to the housing at their edges. It is also possible to even provide hinge like structures 352 as shown to further enhance motion of this portion.

To enhance EMC, the first portion can be connected to a secondary portion referenced in the figure as 340. The second portion is connected to the first portion on a side away from the corner of the housing 105 in this illustrated example. This portion 340 can be stationary in one embodiment and fabricated specifically to enhance EMC.

In this embodiment, this second portion 340 is secured to the outside edge of the housing 100 and will be compatible with covers 110 if they are used. To address weight issue and to enhance the EMC further, the second portion 340 is also fabricated to include a plurality of apertures 344 as shown. The second portion 340 is secured to the housing 100 by a variety of means as known to those skilled in the art. The apertures can be used to enhance and provide for securing means. In addition holes and other means can be provided on the housing, if desired to aid in securing the gasket portion 340 to the housing 100 if desired.

In this embodiment as shown in FIG. 3, this second portion of the gasket 340 is fabricated to match the length of the side of the housing that it will be disposed on. This has been done to enhance EMC but it is possible to selectively change the length of this portion such that it is shorter or alternatively even longer than the length of the housing edge it is being disposed on selectively.

The third portion of the gasket 300 is referenced by numerals 360 and is disposed to the opposing side of the first portion such that it is closer to the side corner of the housing 100. In this arrangement, the first portion is then disposed between the second portion 340 on one side and the third portion 360 on the other side.

In a preferred embodiment, as shown, the third portion is curved also in structure and as before is provided to enhance flexibility of the gasket 300 and to provide a spring like feature to it. It should be noted that while the curved portion of the gasket 200 of FIG. 2 was generally curved away from the housing 100, in this embodiment, the curved portion is disposed between the first portion and the side of the housing 100 such that it provides a wedge as illustrated. The curved portion is then disposed inside the housing and opposed to away from it as illustrated. In a way the curved portion is disposed against the first portion in a manner such that it creates almost a hook for the first portion 350 when viewed from a top down view.

The curved third portion 360 is also secured to the housing 100 on one side and to the rest of the portions of the gasket 300 on the other side. As before, securing means as known to those skilled in the art can be used to achieve this objective. It is possible, however, to have this portion of the gasket 360 to be connected to the housing and the other portions of the gasket in substantially the same side. An example of this is provided and referenced by numerals 370. The numerals 370 provide an edge where the third and first gasket portion comes together. A fastening means is also provided to separately secure the gasket to the housing 100. In addition the structures of the first and third portions are such that they are abutted to an opening in the housing as illustrated. While this enhances the securing means, other and alternative embodiments are possible.

In this embodiment, the other side of the third gasket portion 360 is unsecured which helps the curved portion to be compressed and decompressed as the first portion is moved from a first to a second and back to the first position as the card is plugged and unplugged or as the housing in general is disposed and removed from a larger environment such as a computer frame or rack.

It should be noted that all portions of the gasket 300 is fabricated to be compatible with the design of the housing 100 and its covers 110 when applicable. As before ridges or other design features are added to enhance such compatibility or to further enhance the securing of the gasket 300 to the housing 100.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An EMC gasket comprising:
   a flexible conductive sheet disposed between corner of a first and a second surface of a frame capable of housing electronic components;
   said sheet being larger in area than said corner area such that when disposed, said sheet forms a curved structure;
   said sheet forming a continuous main curved structure and an oppositional curved dip;
   said sheet being fabricated of a material that can be compressed and then decompressed back to its original shape.

2. The gasket of claim 1, wherein said sheet has at least one indenture.

3. The gasket of claim 1, wherein said sheet has a plurality of indentures.

4. The gasket of claim 3, wherein said gasket has an extended appendage for securing said gasket to said frame.

5. The gasket of claim 4, wherein said appendage also includes apertures.

6. The gasket of claim 1, further comprising fastening means for securing said gasket to said frame.

7. The gasket of claim 1 wherein sides of said sheet are formed to be complementary to sides of said frame forming said corner.

8. The gasket of claim 7 wherein said side sheet is secured to said sides in a manner as to provide an overlap.

9. The gasket of claim 1 wherein said sheet is comprised of metal or metal components.

10. An EMC gasket comprising:
    a first conductive portion moveable from a first position to a second position;
    a secondary conductive portion secured to said first portion on one side; said secondary portion being capable of being secured to an outside edge of a computer housing;
    a third conductive portion disposed on an opposite side of said secondary portion such that said first portion is disposed between said second and third portion; said third portion being secured to said first portion on and adjacent side;
    said third portion being fabricated of a flexible material and being curved in structure such that when disposed in a housing, said curved structure is wedged at a corner of said housing.

11. The gasket of claim 10 wherein said first portion is further secured to a movable rod that is secured to said housing; said rod further enabling said movement of said first portion from a first to a second position.

12. The gasket of claim 11 wherein said first portion further comprises a hinge at said edge connected to said second portion to enable its movement from a first to a second position.

13. The gasket of claim 10 wherein said first portion further comprises apertures.

14. The gasket of claim 10 wherein said second portion further comprises apertures.

15. The gasket of claim 14 wherein said second portion is fabricated to be equal in length to that of said housing edge it is secured to.

16. The gasket of claim 10 wherein said first, second and third portions are made of metal and or metal components.

17. The gasket of claim 10 wherein said first, second and third portions are comprised of same material.

18. The gasket of claim 10 wherein said first, second and third portions are comprised of different materials.

19. The gasket of claim 10 wherein said third gasket is made of a material with sufficiently flexible memory such that said gasket can be compressed and decompressed to an initial position when said frame is being plugged in or removed.

* * * * *